United States Patent
Côté et al.

(10) Patent No.: US 6,760,874 B2
(45) Date of Patent: Jul. 6, 2004

(54) TEST ACCESS CIRCUIT AND METHOD OF ACCESSING EMBEDDED TEST CONTROLLERS IN INTEGRATED CIRCUIT MODULES

(75) Inventors: Jean-François Côté, Chelsea (CA); Benoit Nadeau-Dostie, Aylmer (CA)

(73) Assignee: LogicVision, Inc., San Jose, CA (US)

( * ) Notice: Subject to any disclaimer, the term of this patent is extended or adjusted under 35 U.S.C. 154(b) by 84 days.

(21) Appl. No.: 10/139,294

(22) Filed: May 7, 2002

(65) Prior Publication Data
US 2003/0212524 A1 Nov. 13, 2003

(51) Int. Cl.[7] ............................................. G01R 31/28
(52) U.S. Cl. ....................................... 714/724; 714/729
(58) Field of Search ................................ 714/724, 729, 714/236; 713/502; 324/73.1; 326/16

(56) References Cited

U.S. PATENT DOCUMENTS

| | | | | |
|---|---|---|---|---|
| 4,348,743 A | * | 9/1982 | Dozier ........................ | 713/502 |
| 4,896,258 A | * | 1/1990 | Yamaguchi et al. ......... | 712/236 |
| 5,928,374 A | * | 7/1999 | Shimizu et al. .............. | 714/724 |
| 6,006,347 A | * | 12/1999 | Churchill et al. ........... | 714/724 |
| 6,191,603 B1 | | 2/2001 | Muradali et al. | |
| 2002/0040458 A1 | * | 4/2002 | Dervisoglu et al. ......... | 714/729 |

FOREIGN PATENT DOCUMENTS

WO  WO 01/53844 A1  7/2001

OTHER PUBLICATIONS

Dervisoglu, "A Unified DFT Architecture for Use with IEEE 1149.1 and VSIA/IEEE P15000 Compliant Test Access Controllers", Design Automation Conference, Jun. 18–22, 2001.

* cited by examiner

*Primary Examiner*—Albert Decady
*Assistant Examiner*—Dipakkumar Gandhi
(74) *Attorney, Agent, or Firm*—Eugene E. Proulx

(57) ABSTRACT

A test access circuit (TAC) for use in controlling test resources including child test access circuits (TACs) and/or test controllers, in an integrated circuit, comprises an enable input for enabling or disabling access to the test resources, a test port associated with each test resource, each test port including a test port enable output for connection to an enable input of an associated test resource; and an input for receiving a serial output of the associated test resource; and a selector for selecting a test resource for communication therewith.

53 Claims, 5 Drawing Sheets

TEST ACCESS CIRCUIT AND METHOD OF ACCESSING EMBEDDED TEST CONTROLLERS IN INTEGRATED CIRCUIT MODULES

BACKGROUND OF THE INVENTION

1. Field of the Invention

The present invention relates, in general, to testing of integrated circuits, and, more specifically, to an improved test access circuit and method of controlling test access circuits to facilitate access to embedded test controllers in circuit modules associated with test access circuits.

2. Description of Related Art

As complexity of integrated circuits continues to increase, partitioning of the integrated circuits into blocks or modules becomes necessary to simplify the design, verification, physical implementation, test and enable concurrent engineering of the blocks. It is anticipated that block reuse from one chip to the next or from one design team to another (possibly from different companies) will become the standard in a near future.

The problem addressed by the proposed invention is related to the test of such complex chips partitioned into blocks. It is desired to control test resources (e.g. test controllers or simple scan chains) using a method that will be compatible with new hierarchical design methodologies. The IEEE 1149.1 Test Access Port (TAP) is a popular way for controlling test resources on a chip. However, it is no longer practical to have this single test access circuit (TAC) in direct control of all test resources because of the number of connections between the TAP and the test resources that causes layout congestion around the TAP and because it would suggest a non-standard test interface for each block that would depend on the number and type of test resources in it. The latter issue is clearly not acceptable especially for blocks obtained from third parties. It is also an issue when the blocks are designed concurrently and the test resources are actually not known until the last minute.

In an effort to obviate these problems, and emerging IEEE P1500 standard proposes a test access circuit to de-centralize the control of test resources. The proposed test access circuit is similar to the IEEE 1149.1 Test Access Port (TAP) in that it has an instruction register and control circuitry that provides access to the various test resources. More specifically, it has an external interface consisting of at least a serial input, a serial output, a clock and a number of control inputs for use in configuring the test access circuit to perform an access to its instruction register or one of the test resources under its control. It also has an internal interface consisting of at least a serial output, a number of serial inputs corresponding to the number of test resources under its control and a number of control outputs for the same test resources.

The ultimate goal is to perform operations on test resources connected to a test access circuit connected at an arbitrary level of test access circuit hierarchy. As mentioned above, test resources can consist of test controllers or simple scan chains. There are two types of operations to be performed on test controllers. The first type consists of all operations related to the execution of a test whereas the second type consists of all operations related to the preparation of a test or diagnosis. The first type only requires access to the instruction register of the test access circuit connected to the test controller of interest. The second type also requires access to test data registers that are internal to the test controller.

Methods have been proposed to interconnect test access circuits. Muradali et al U.S. Pat. No. 6,191,603 granted on Feb. 20, 2001 for "Modular Embedded Test System for Use in Integrated Circuits", suggests concatenating the serial input and output of all test access circuits of an integrated circuit. There is no mechanism for individually enabling only one test access circuit. Although simple, this approach requires loading instructions in all test access circuits every time an instruction change is needed in any one of the test access circuits. This results in longer times to load instructions. Also, the method is not compatible with a block based design approach because it is not possible to verify blocks independently of other blocks and without any knowledge of the contents of other blocks which might not be defined. Other disadvantages of this method is that a failure in a single test access circuit can prevent the user from running any internal or external test and make it very difficult to diagnose the source of the problem.

Dervisoglu et al WO 01/53844 published on Jul. 26, 2001 for "Hierarchical Test Circuit Structure for Chips with Multiple Circuit Blocks" uses a different method that partially addresses the problem of long instruction streams. Dervisoglu introduces the concept of test access circuit hierarchy where test operations are transferred downward and upward in the hierarchy. A child TAC is selected by setting a bit in the instruction register of the parent TAC that is reset/deselected once a bit in the instruction register of the child TAC is set. The bit in the instruction register of the parent TAC is then cleared which, in turn, causes the child to be reset/deselected. Child TACs are reset as soon as they are deselected. This limitation does not allow running test controllers in parallel in different TACs. The architecture still requires concatenating TAC circuits at a same level of hierarchy, requiring sending long, instruction streams (although shorter than those of Muradali) to groups of TACs at the same time. The protocol also makes it difficult to navigate quickly through the test access circuit hierarchy especially when test resources, like test/BIST controllers, need to be accessed concurrently in different branches of the hierarchy. A malfunction of the child TAC circuits can be fatal for the parent TAC and reduce the possibility of diagnosing problems.

One of the primary functions of the TACs discussed in both Muradali and Dervisoglu is to configure a block in an external test mode to verify the connections and logic between blocks. TACs at a given level of test hierarchy need to receive a specific instruction from the parent block to be configured in that mode. In addition, there is no standard for this instruction (as opposed to the IEEE 1149.1 standard). Both of these factors complicate entering the external test mode. Also, there is no provision for including the logic of child TACs as part of the external test mode to facilitate the identification and diagnosis of faulty child TACs.

SUMMARY OF THE INVENTION

Figure 2:
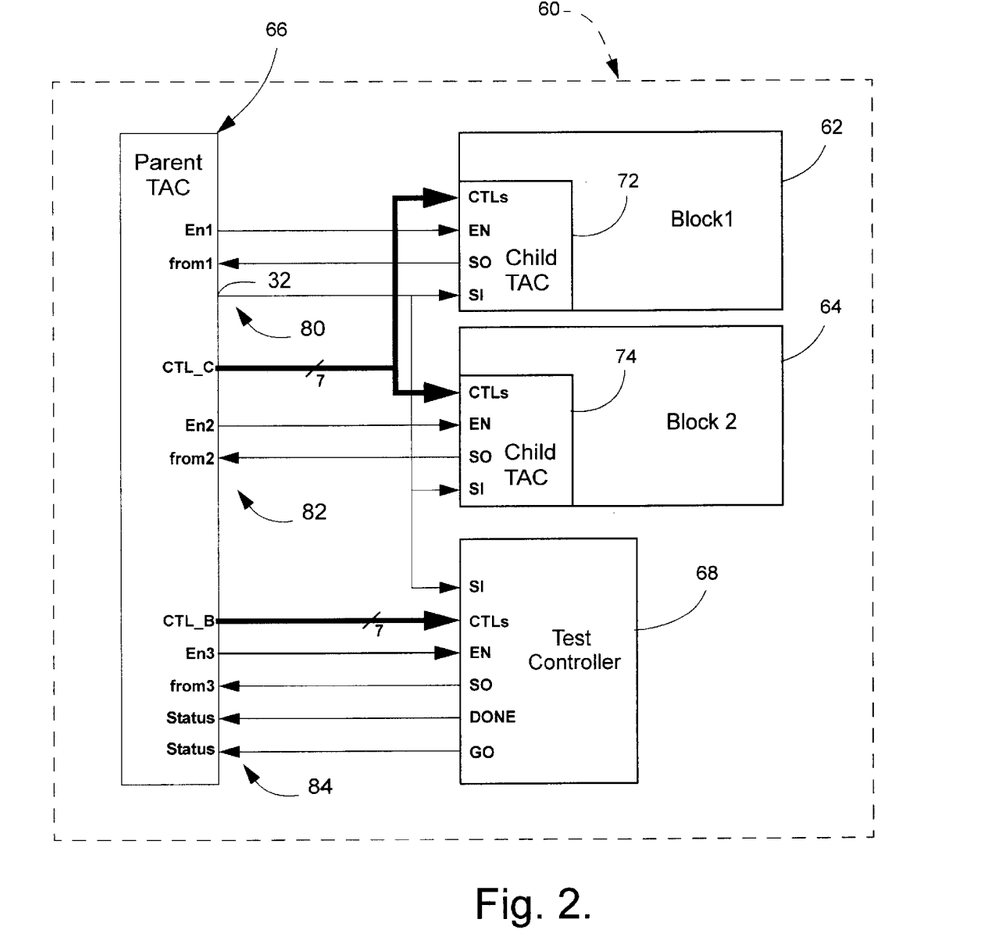
FIG. 2 shows connections between test access circuits and test controllers, according to an embodiment of the present invention.

The test access circuit hierarchy consists of a test access circuit at the first (or top) level of a block and a certain number of test access circuits and test resources (e.g. scan chain, test controllers) connected to it as shown in FIG. 2. These test access circuits and test controllers constitute a second level of the test access circuit hierarchy. Each test access circuit of the second level can, in turn, control any number of test access circuits and test controllers which constitute a third level of the test access circuit hierarchy and so on. The last level of this hierarchy consists only of test controllers. When the block is the entire chip, the test access circuit at the first level of hierarchy is preferably an IEEE 1149.1 TAP. The test access circuit hierarchy does not necessarily depend on the actual design hierarchy.

One aspect of the present invention is generally defined as an improvement in a test access circuit for use in accessing test controllers in an integrated circuit having a hierarchy of test access circuits which control respective test resources in the integrated circuit, the improvement comprising a test access circuit instruction register having a child test access circuit configuring register which is configurable for serial interconnection with other registers of the instruction register when the test access circuit is configured in instruction register access mode and which serially connected in a scan path between a serial input and a serial output when the test access circuit is configured in a data register access mode. As will be seen, the configuring register simplifies and facilitates configuring parent test access circuits of circuits being accessed.

Another aspect of the present invention is generally defined as a method of accessing a test controller in an integrated circuit having a plurality of test access circuits arranged in a plurality of levels of test access circuit (TAC) hierarchy including a top-level TAC and at least one child TAC connected to the test controller, the method comprising loading an instruction into the top-level TAC to select a test port corresponding to a child TAC; and configure the child TAC to perform an instruction register access by setting a child instruction register select bit to an active value; and loading an instruction into the child TAC to select a test port corresponding to the test controller; and configure the test controller to perform desired test operations by setting test controller control bits to values corresponding to the desired operations.

A recursive embodiment of the method is generally defined as a method of configuring test access circuits for accessing test controllers in an integrated circuit having a hierarchy of test access circuits which control test resources in the integrated circuit, the method comprising, for each test access circuit in a scan path between a serial input and a serial output and containing a serial input and serial output of a grandparent test access circuit of a target test controller, loading an instruction into the test access circuit to insert the instruction register of a selected child test access circuit into the scan path; and replacing the instruction register of the test access circuit in the scan path by a child test access circuit configuring register of the instruction register of the test access circuit.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

Definitions

A parent test access circuit is a test access circuit which resides at the next level up of test access circuit hierarchy;

A grandparent test access circuit is a test access circuit which resides two levels up in test access circuit hierarchy;

A child test access circuit is a test access circuit which resides at the next level down of test access circuit hierarchy;

A test port is connected to either a test controller or a test access circuit;

A data register may be a register which is connected directly to a test access circuit or which is part of a test controller;

An instruction register access means receiving an instruction and/or scanning out status information about test controllers. An instruction register access by a TAC is also a data register access by its parent TAC A data register access at the level of a test controller means receiving/sending test data from/to the test controller (setup or diagnosis).

Figure 1:
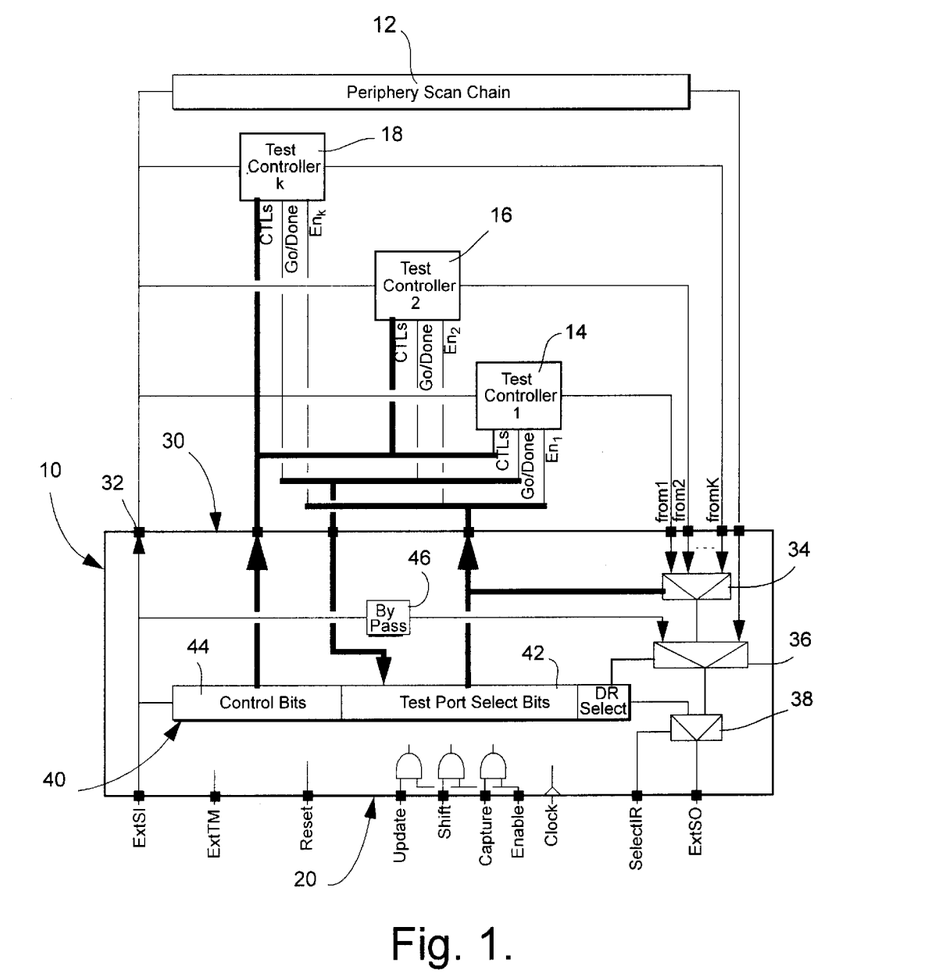
FIG. 1 illustrates a test access circuit connected to several test controllers, according to an embodiment of the present invention.

FIG. 1 shows an example of a test access circuit (TAC) 10 connected to various test resources including a scan chain 12, and test or BIST controllers 14, 16, and 18. TAC 10 has an external interface 20 for accessing a TAC at the next level up of design hierarchy, an internal interface 30 for accessing embedded test controllers and embedded TACs at the next level down of test hierarchy, and an instruction register 40.

As best shown in FIG. 2, described later, each test controller has a serial input, a serial output, a number of control inputs, CTLs, and a test controller enable input, EN. Optionally, test controller outputs other than the serial output can be connected to the instruction register. In the example, the GO and DONE test controller outputs are connected to the status bits of instruction register 40 of the TAC 10.

External interface 20 comprises a serial input, ExtSI, a serial output, ExtSO, a clock input, Clock, and a number of control inputs (all remaining signals). One of the control inputs is an instruction register select input, SelectIR, which, when active, selects the instruction register or, when inactive, selects a test data register. A TAC enable input, Enable, enables access to the TAC and its test resources, including test controllers and embedded TACs, of a circuit logic block when set to an active value and disables access thereto when set to an inactive value. In FIG. 1, the Enable signal is shown to gate the Update, Shift and Capture signals to enable/disable access to any of the registers (instruction or data). An external test mode input, ExtTM, configures the TAC in an external test mode when set to an active value.

Internal interface 30 comprises a serial output 32, a number of serial inputs, $from_1$, $from_2$, ..., $from_k$, control outputs, CTLs, connected to the test controllers and a number of enable outputs, $En_1$, $En_2$, ..., $En_k$, connected to a corresponding enable input of each test resource under the control of the TAC. The number of serial inputs corresponds to the number of test ports. In the example circuit illustrated in FIG. 1, the number of test ports corresponds to the number of test controllers, which is k. Embedded TACs can also be connected to test ports as explained later. Each of serial inputs, from$_1$, from$_2$, . . . , from$_k$, originate from the serial output of a corresponding test resource and are applied to a corresponding input of a selector or multiplexer 34 in the parent TAC. The control input of selector 34 is connected to test port select bits 42 of instruction register 40.

Test port select bits 42 are used for selecting a test port and determine the state of the enable outputs En$_1$, En$_2$, . . . En$_k$. The selected test port can be either a test controller or a TAC. The test port select bits can be decoded or used directly to enable the various test ports and/or select their serial output. The instruction register also has control bits 44 that can be decoded or used directly to generate the control outputs of the internal interface. Optionally, additional bits, such as DR select, of the instruction register can be used to select other test resources such as scan data registers. For example, periphery scan chain 12 can be used during the external test mode and is one of the mandatory test resources of the IEEE P1500 standard. To that end, a selector 36 receives the output of selector 34 and of periphery scan chain 12 and under control of the DR Select bits. A one-bit bypass scan data register 46 is another mandatory scan data register of the IEEE P1500 standard that is useful in reducing the amount of test data to be shifted in and out when TACs are connected serially. Bypass register 46 is connected between serial input ExtSI and an input to selector 36. A further selector 38 receives the serial output of instruction register 40 and of selector 36 under the control of the SelectIR input. The output of selector 38 is connected to serial output ExtSO of TAC 10.

FIG. 2 shows, in more detail, the connections when a parent TAC has child TACs and test controllers connected to its test ports. For simplicity, only internal interface 30 is shown. In a first embodiment, all TACs (parent and children) are as described with reference to FIG. 1. In a second embodiment, the external interface of the parent test access circuit is as described by the IEEE 1149.1 standard. The connections between the parent and child TACs are the same in both embodiments.

FIG. 2 shows a parent block 60 having two embedded logic blocks or cores 62 and 64. Block 60 includes a parent TAC 66 and a test controller 68. Blocks 62 and 64 include child TACs 72 and 74, respectively. Child TACs 72 and 74 are connected to first and second test ports 80 and 82 of parent TAC 66. Test controller 68 is connected to a third test port 84. More TACs and test controllers could have been connected to parent TAC 66.

Each test port requires only two unique signals, namely, an enable signal (En$_1$ to En$_k$) and the serial output of a corresponding TAC or test controller. As previously indicated, test controller status outputs are optionally connected to corresponding status inputs of the parent TAC. The serial input, SI, of all TACs and test controllers are connected to the serial output 32 of the parent internal interface 30. All TACs share the same control outputs CTL_C sourced by the parent TAC. Similarly, all test controllers share the same control outputs, CTL_B, sourced by the parent TAG. The test controller control outputs may be different from those used for TACs.

The parent TAG control outputs, CTL_C, include a test access circuit configuring bit, Child IR Select, which is connected to each of the child TACs. This bit is connected to the instruction register select input, SelectIR, of each child TAG and, thus, is directly controlled by a bit of the parent instruction register. The control outputs correspond to inputs applied to external interface 20.

There are several advantages to the architecture thus far described. The test interface of the blocks is completely independent of the number and type of its test resources. The architecture allows the interface to be defined early in the design process and also allows adding entire blocks to the design of the chip without having to change the method used to access test resources in other blocks. It allows verification of blocks completely independently of other blocks. It allows running test controllers in different blocks at the same time using different test parameters under the control of the instruction of the selected block(s). Some blocks can even continue to operate in functional mode while others are in test mode. These are significant advantages compared to other methods.

Test resources under the control of a child TAC can be accessed using the following method:

Step 1: Load an instruction into the top-level (parent) TAC to select a test port corresponding to a TAC and configure the child TAC to perform an instruction register access. This is done by setting the test port select bits of the parent TAC Instruction Register to the value corresponding to the selected TAC and setting the Child IR Select bit to its active value.

Step 2: Load an instruction into the selected child TAC to select a test port corresponding to a test controller and configure the test controller to perform operations. Operations include setup/shift mode or run mode. This is done by setting the control bits driving the CTL_B bits of the selected child TAC to the values corresponding to the desired operation.

Test controllers that have a default mode of operation, i.e., that do not require setup, can be configured in run mode at this point. In this case, the execution and results of the test are observed via the status inputs connected to the test controller outputs, as is well known in the art. Step 2 is repeated as many times as desired until the test is finished. The status inputs are sampled each time the instruction register is reloaded in the selected child TAC and their values can be observed. Once the test of the selected controller is finished, step 2 is repeated again with different control bits and test port select bits to select another test controller or to simply de-select all controllers. Note that several controllers can be enabled in parallel in default mode. However, only one of the serial outputs (from$_1$ to from$_k$) can be selected at any given time.

Different steps are needed if the test controller requires setup before entering into a run mode. In step 2 above, the instruction loaded in the child TAC will configure the selected test controller to perform a test data register access which simply involves shifting data through a register internal to the test controller. The following additional steps are required:

Step 3: Load an instruction into the parent TAC to configure the selected child TAC to perform a test data register access.

Step 4: Perform a test data register access. This is done by applying the appropriate inputs to the external interface of the parent TAC to shift data through the selected data register.

Step 4 can be repeated a number of times depending on the selected test controller. As mentioned above, a test controller can consist of scan chains only and the test performed can be a regular scan test requiring multiple scan chain loads. After step 4 has been performed, the following steps are performed:

Step 5: Load an instruction into parent TAC to configure the selected child TAC to perform an instruction register access.

Step 6: load an instruction into the child TAC to configure the selected test controller into a run mode. As with step 2, this step can be repeated to monitor the status inputs during the execution of the test. Step 6 can then be modified to load an instruction selecting another test controller or de-selecting all test controllers at the end of the test.

Padding Circuit

The architecture thus far presented would allow any number of levels of TACs in the test hierarchy. However, the access method itself does not scale as gracefully. Many more steps are needed and these steps are not easily described algorithmically. All the additional steps needed relate to the control of the Child IR Select bits of TACs located at intermediate levels of TAC hierarchy.

In accordance with a further embodiment of the present invention, the TACs are modified to simplify access so that significantly fewer steps are needed to access test resources and the access steps are easy to derive algorithmically. The modification involves the provision of a test data register (TDR) padding circuit which inserts or appends the Child IR Select bit of a TAC into the scan path used to load instructions or data into TAC instruction or data registers. In a preferred embodiment, the padding circuit is a shift register element of the instruction register of a TAC. This element operates in the same manner as other shift register elements when the instruction register is selected (SelectIR is active). In this mode, the instruction register resides in the scan path. However, when the instruction register is not active (SelectIR is inactive), the padding circuit or bit replaces the instruction register and remains in the scan path. This means that whenever an instruction or data is loaded in a register associated with a downstream TAC, the instruction includes a bit, the Child IR Select bit, for each upstream TAC in the scan path. This allows each of the upstream TACs to be configured in the desired mode without loading any additional instructions. These configuration bits specify the configuration of TACs for the next instruction or data scan operation.

The insertion of the Child IR Select instruction register bit into the scan path can be made conditional on the state of another instruction register bit 90, called the Link bit. The Link bit is set whenever the test port select bits 42 select a child TAC. Alternatively, the Link bit can be omitted and the padding bit always inserted. The only consequence is that all data register access will have an extra bit to shift in and out which is usually not a problem.

The TDR padding circuit allows quickly switching from an instruction register access or a data register access to the other without having to configure the parent TAC itself into a different mode to modify the Child IR Select bit. The method is recursive and any level of TAC hierarchy is supported. One padding bit is added for each level of hierarchy. By making the Child IR Select bit of all parent TACs part of any data register access, it is very easy to navigate through the test hierarchy and return to an instruction register access of any of the parents, possibly to access a register in a different block.

Figure 3:
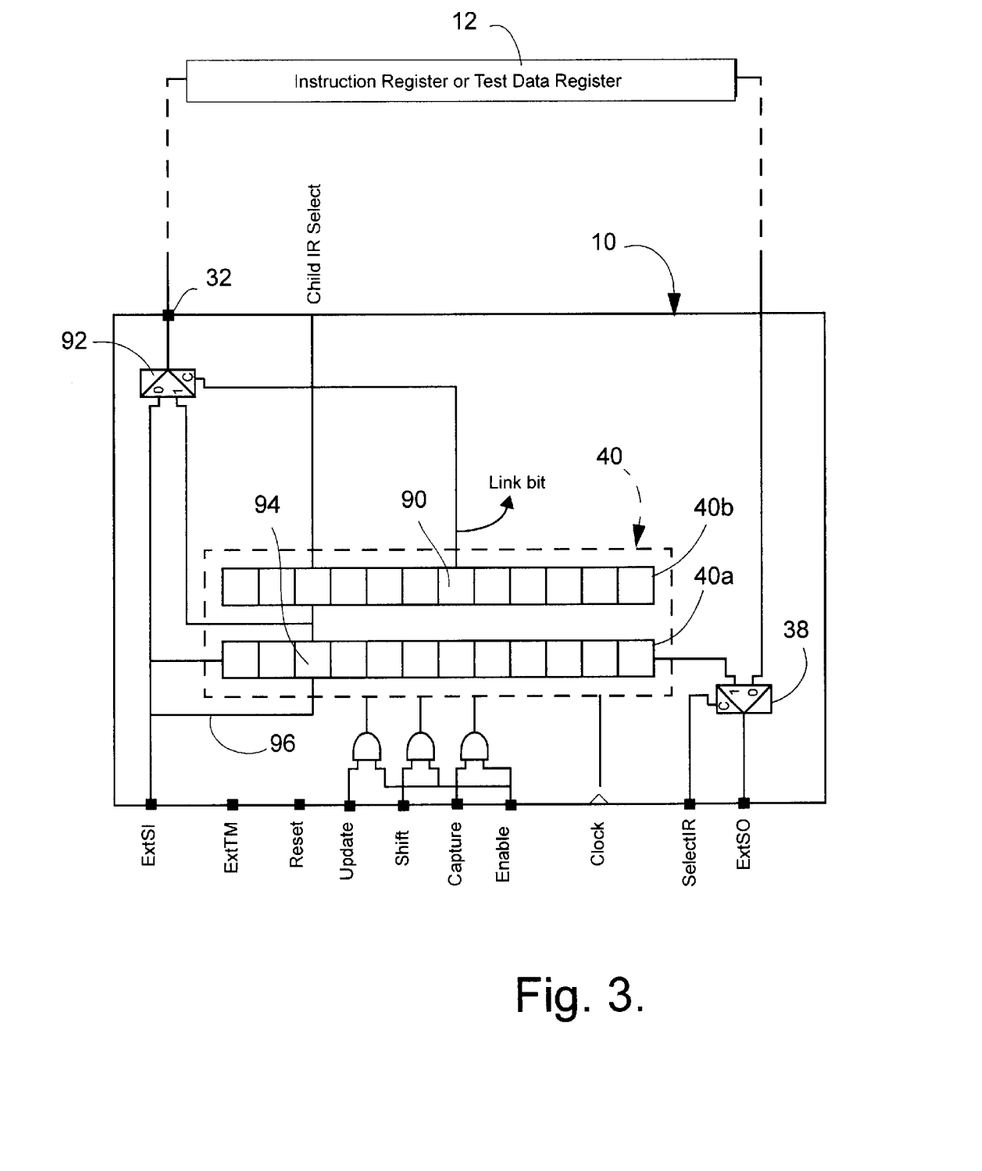
FIG. 3 shows a test data register padding circuit, according to an embodiment of the present invention.

The modifications to the TAC architecture are shown in FIG. 3, which uses the same reference numerals as FIG. 1 to designate like elements. In FIG. 3, the dashed line represents Instruction Register 40. The figure shows the shift register portion 40a and parallel connected update register portion 40b of the Instruction Register. Link bit 90 of the instruction register controls a selector or multiplexer 92 that selects between the serial input of the TAC and the serial output of the Child IR Select instruction bit. When the Link bit is active, Child IR Select bit 94 is inserted into the scan path.

The serial input of the TAC is also connected to the serial input of the Child IR Select bit, as shown at 96, whenever the TAC is not itself configured to perform an instruction register access, i.e., when signal SelectIR is inactive. This will become clearer in the description of FIGS. 4 and 5.

Figure 4:
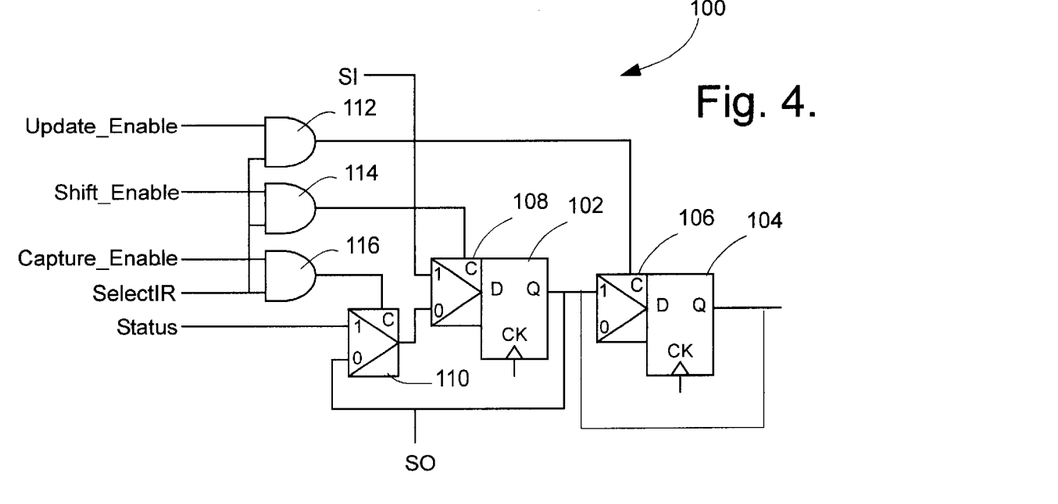
FIG. 4 is a schematic of a typical instruction register element, according to an embodiment of the present invention.
Figure 5:
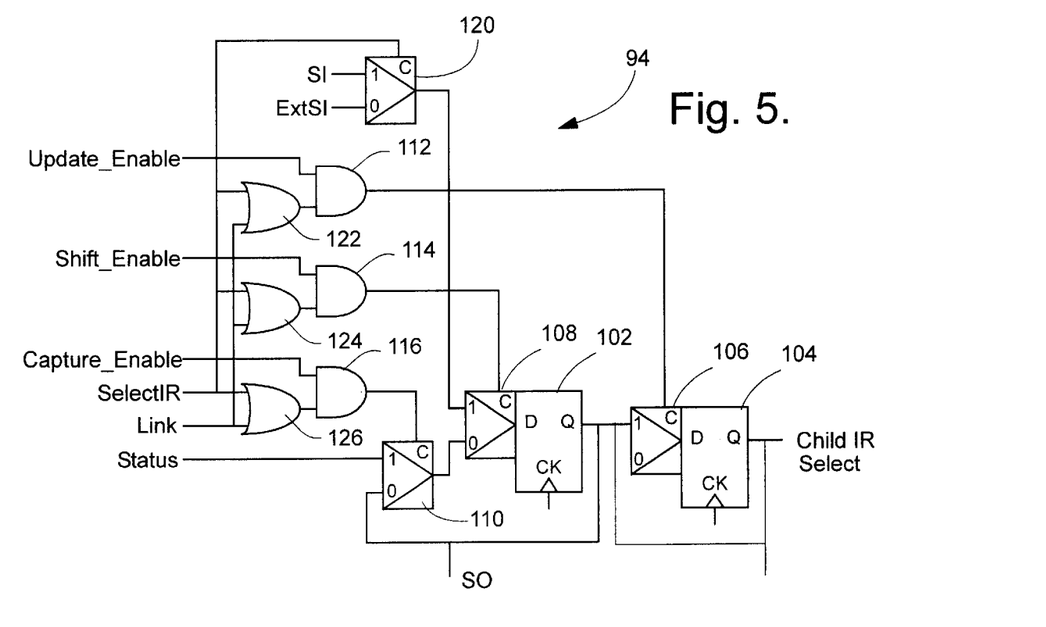
FIG. 5 is a schematic of an instruction register padding circuit element, according to an embodiment of the present invention.

FIG. 4 shows a typical instruction register bit 100. FIG. 5 shows the modifications required for the Child IR Select bit 94.

Referring to FIG. 4, a typical instruction register bit includes a shift register element 102 connected to an associated update latch 104 via a multiplexer 106. The input to element 102 receives the output of multiplexer 108. The output of the shift register element is connected to the 1 input of multiplexer 106 and to a serial output, SO, which in turn is connected to the serial input of the next shift register element. The 0 input of multiplexer 106 is connected to the output of update register 104. The 0 input of a multiplexer 108 receives the output of a multiplexer 110. The select input of multiplexer 106 is controlled by the output of AND gate 112 which receives an Update_Enable signal and the SelectIR signal. The 1 input of multiplexer 108 receives scan data input, SI, while the 0 input receives the output of multiplexer 110. Multiplexer 110 selects between a status input and the output of shift register element 102 under control of AND gate 116. Gate 116 receives a Capture_Enable signal and SelectIR. The select input of multiplexer 108 receives the output of AND gate 114 which gates a Shift_Enable signal with SelectIR. It will thus be seen that the instruction register bit only performs update, shift and capture operations when SelectIR is active.

In this embodiment, all registers 102 and 104 are assumed to be clocked by the same clock provided at the input of the TAC. This is why holding multiplexers 106 and 110 are needed. An alternate embodiment would gate the clock input with the shift, capture and update control signals to generate different clocks for registers 102 and 104.

FIG. 5 illustrates Child IR Select bit 94 also referred to herein as a padding circuit. In general, the bit is a typical instruction register bit that is modified such that the shift/capture/update operations are performed on the Child IR Select bit as if this bit was part of the test data registers being accessed. The Child IR Select bit differs from the bit shown in FIG. 4 by for the provision of multiplexer 120 and OR gates 122, 124 and 126. Multiplexer 120 receives scan data input SI at its 1 input and the TAC serial input ExtSI at its 0 input. The select input for multiplexer 120 is the SelectIR input. Thus, when the TAC is in instruction register access mode (SelectIR=1), the serial input to the bit is the same as the typical instruction register bit. However, in data register access mode (SelectIR=0), the input to the bit is the serial input of the TAC (ExtSI).

One input of each of the OR gates is the Link bit and the other input is the SelectIR input. OR gate 122 gates the Update input of Child IR Select bit so that it becomes active whenever the Update signal and the SelectIR signal or the Link bit are active. OR gate 124 gates the Shift input of child IR select bit so that it becomes active whenever the Shift signal and the SelectIR signal or the Link bit are active. OR gate 126 gates the capture input of Child IR Select bit so that it becomes active whenever the Capture, the SelectIR signal or the Link bit are active. Thus, when TAC is in instruction register access mode (SelectIR=1), the Child IR Select bit is the same as the typical instruction register bit. However, in data register access mode (SelectIR=0), the bit responds to active Update, Shift and Capture inputs and thus can receive and capture data applied to the TAC serial input. In the preceding discussion, it is to be understood that the TAC is selected by an active Enable input. Then, the Shift signal is the same as the Shift_Enable signal. The same applies to the Update and Capture signals. If the TAC is not selected (Enable input is inactive), then the circuit does not respond to the Shift, Update and Capture signals.

In summary, the serial output of an instruction bit is connected to the serial input of the Child IR Select bit when the SelectIR signal is active and the serial input of the TAC external interface is connected to the serial input of the Child IR Select bit when the SelectIR signal is inactive; and the serial output of the Child IR Select bit is connected to the serial output of the internal interface when the Link bit is active, otherwise, the serial input of the TAC is connected to the serial output of the internal interface when the Link bit is inactive.

As indicated earlier, the Link bit is optional and the logic above can be simplified by considering the Link bit as always being active. This way, the only modification consists of controlling the serial input of the Child IR Select bit and always performing a shift, capture or update operation whenever the corresponding TAC input signal (Shift, Capture, Update) is active and the Enable signal is active.

The TDR padding circuit can also be added in the return path from the registers accessed instead of on the path to the registers. The last two connection steps above simply need to be changed to the following:

connecting the serial input corresponding to the selected test port to the serial input of the Child IR Select bit and connecting the serial output of the Child IR Select bit to the serial output of the external interface of the TAC when the Link bit is active; and connecting the serial output of the instruction register to the serial output of the external interface of the TAC when the SelectIR input is active.

Recursive Test Access Method

In general, the recursive test access method of the present invention comprises, for each test access circuit in a scan path between a serial input and a serial output and containing a serial input and serial output of a parent test access circuit of a target test controller, loading an instruction into the test access circuit to insert the instruction register of a selected child test access circuit into said scan path; and replacing the instruction register of the test access circuit in said scan path by a child test access circuit configuring register of the instruction register of the test access circuit.

EXAMPLE

An example of the recursive test access method that this new architecture allows will now be described. In this example, it is desired to perform operations on a test controller that is at level 4 in the hierarchy of TACs and test controllers (TC). That is, the test controller is accessed through three levels of TACs. The following is a brief explanation of register descriptions used hereinafter:

IR_n represents the instruction register (IR) of TAC at level n;

DR_n represents a data register (DR) access at level n;

Child_IR_sel_n: is a bit of an IR that configures the TAC at level n+1 in instruction register or data register access mode;

Link_n: is a bit of an IR that causes the Child_IR_sel_n bit to be inserted into the scan path of the selected data register. This padding is performed at the beginning of the data register, but could be done at the end. The link bit is used to enable padding only if the selected port is a TAC in this example. However, padding could be used even if this is not the case.

Registers are concatenated with commas in the register description. That is, Child_IR_sel_1, . . . , Child_IR_sel_n−1, IR_n, means that the register being scanned is composed of the instruction register of level n and the Child IR Select bit of levels 1 to n−1.

TP_sel_n are the Test Port Select bits of TAC at level n. These bits select a test port. A test port is either a TC (Test Controller) or a child TAC.

Mode bits indicate the type of operations performed by a controller. Setup modes are used to prepare a test controller to perform a test or collect diagnostic information. Run modes are used to cause the execution of a test.

Table I below outlines the various steps:

TABLE I

| Step | Scan Register Description | Bit Settings | Comments |
|---|---|---|---|
| 1 | IR_1 | set TP_sel_1 | Select TAC at level 2. |
| | | set Child_IR_sel_1 | Insert IR_2 in scan path. |
| | | set Link_1 | Insert Child_IR_sel_1 in path. Remove IR_1 from path by applying inactive value to SelectIR input of TAC at level 1. |
| 2 | Child_IR_sel_1, IR_2 | set TP_sel_2 | Select TAC at level 3. |
| | | set Child_IR_sel_2 | Insert IR_3 in scan path. |
| | | reset Child_IR_sel_1 | Remove IR_2 from path. |
| | | set Link_2 | Insert Child_IR_sel_2 in path. Keep IR_1 out of path as in step 1. |
| 3 | Child_IR_sel_1, Child_IR_sel_2, IR_3 | Set TP_sel_3 | Selects a test controller. |
| | | set Mode | Setup is required in this case. |
| | | reset Child_IR_sel_2 | Remove IR_3 from path. |
| | | reset Child_IR_sel_1 | Keep IR_2 out of scan path. Keep IR_1 out of scan path as in step 1. Link bit is not useful and not set. |

TABLE I-continued

| Step | Scan Register Description | Bit Settings | Comments |
|---|---|---|---|
| 4 | Child_IR_sel_1, Child_IR_sel_2, DR_4 | load DR set Child_IR_sel_2 reset Child_IR_sel_1 | Next step is an IR_3 load. Insert IR_3 in scan path. Keep IR_2 out of scan path Keep IR_1 out of scan path as in step 1. |
| 5 | Child_IR_sel_1, Child_IR_sel_2, IR_3 | Set TP_sel_3 set Mode set Child_IR_sel_2 reset Child_IR_sel_1 | Re-selects the test controller. Configure run mode this time. Insert IR_3 in scan path. Keep IR_2 out of scan path Keep IR_1 out of scan path as in step 1. Repeat step 5 as many times as needed. Observe status bits if needed. |
| 6 | Child_IR_sel_1, Child_IR_sel_2, IR_3 | set TP_sel_3 set Mode reset Child_IR_sel_2 reset Child_IR_sel_1 | Extract results in setup mode. Enable access to data register Remove IR_3 from path. Keep IR_2 out of scan path. Keep IR_1 out of scan path as in step 1. |
| 7 | Child_IR_sel_1, Child_IR_sel_2, DR_4 | load DR set Child_IR_sel_2 reset Child_IR_sel_1 | Next step is an IR_3 load. Could set this bit if next instruction is for TAC of level 2 |

The recursive algorithm to enable access to a test controller generally comprises three steps as follows:

Step 1

Step 1 has two parts and comprises, for each TAC at levels 1 to N−1 of TAC hierarchy:

(a) loading an instruction into the TAC to select a test port and, if the test port is associated with a child TAC, the instruction includes TAC control data to configure the child TAC to perform instruction register access. The control data includes an active Child IR Select bit. The instruction re-configures the TAC to perform a data register access. This is achieved by re-setting, to its inactive value, the Child IR Select bit of the parent TACs which are added to the current instruction. This is possible because the instruction is routed through the padding bit of all parent TACs. If the TAC is the top-level TAC, the reconfiguring of the TAC to perform a test data register access is done by applying an inactive value to the SelectIR input of the TAC. If desired, the step of loading an instruction can include reading out status bits of the instruction register by performing a capture operation prior to the start of shifting in of the instruction.

If the selected test port is associated with a test controller, the instruction includes test controller control bits, the CTL_B bits, to configure the test controller to perform test a data register access by setting the CTL_B bits to the appropriate values to perform a setup or scan mode operation. At this step, the test controller can, alternatively, be configured to perform a default test which does not require a setup operation.

(b) Configuring the test data register padding circuit to add Child IR Select bit to next access to a data register. This step can be omitted for the TAC of level N−1, i.e., the TAC which is the immediate parent of the test controller. This step can be conditional on the Link bit being set to an active value by the instruction.

Step 2

This step is optional. It is only required when a test controller requires setup or when a test data register is accessed. This step is repeated as many times as required. The step comprises:

Performing a test data register access, and, if the next operation is an instruction, configuring the immediate parent TAC selecting the test controller (i.e. the TAC at level N−1) to perform an instruction register access. This is done by setting the Child IR Select bit of the TAC at level N−2 added to the test data register by the TDR padding circuit. If the next operation is another test data register access, the step configures the parent TAC which is selecting the test controller (i.e. TAC at level N−1) to perform a data register access. This is done by re-setting the Child IR Select bit of the TAC at level N−2 added to the test data register by the TDR padding circuit.

Step 3

This step is optional. It is only required if a test controller requires setup when a test data register is accessed.

After performing the last data register access, an instruction is loaded into the TAC at level N−1 to configure the test controller to perform a test. Before loading the instruction, the last data register access set the Child IR Select bit of the parent TAC, which was added to the instruction by the TDR padding circuit. This is done by setting the CTL_B bits to the appropriate values to select a run mode. This is followed by configuring the TAC of level N−1 to perform a test data register access. This is done by re-setting the Child IR Select bit of the parent TAC added to the instruction by the TDR padding circuit.

A final aspect of this invention relates to the simplification of the access to the periphery scan chain connected to child TACs when a parent TAC performs an internal test of a block with which it is associated and, the improvement of the testability and diagnosability of the child TACs themselves. As currently designed, child TACs require loading an instruction to select their periphery scan chain. Each TAC might require a different instruction to perform this selection. This complicates the application of the block internal test and it must be assumed that the child TACs are functional. This is difficult to guarantee if the TACs are only tested functionally as opposed to structurally using scan test methods. Such functional tests do not allow to easily determine the source of a problem as is the case with scan test methods.

In accordance with the present invention, these difficulties are overcome by providing an input, ExtTM, which is controlled by the parent TAC, which is added to the external interface of all child TACs such that they enter an external test mode when ExtTM is active. In this mode, the periphery scan chain and all registers configured in scan chains that are part of the TACs are made accessible at the child block boundary. These scan chains are used during the internal test of the parent block. The logic of the child TACs is tested in the same manner as any other logic of the parent block using conventional scan test methods. This way, all child TACs can be thoroughly tested before being used to perform any operation. Potential problems can also be easily diagnosed, if need be. In order to perform an internal test of the parent block, it might be advantageous to use a simplified model of the child blocks as described in Applicant's U.S. patent application Ser. No. 09/626,877 Filed on Jul. 27, 2000, for "Hierarchical Design And Test Method And System, Program Product Embodying The Method And Integrated Circuit Produced Thereby", incorporated herein by reference. The application explains how to generate a simplified model that would include only the periphery scan chain and logic, including the TAC chains and logic.

Figure 6:
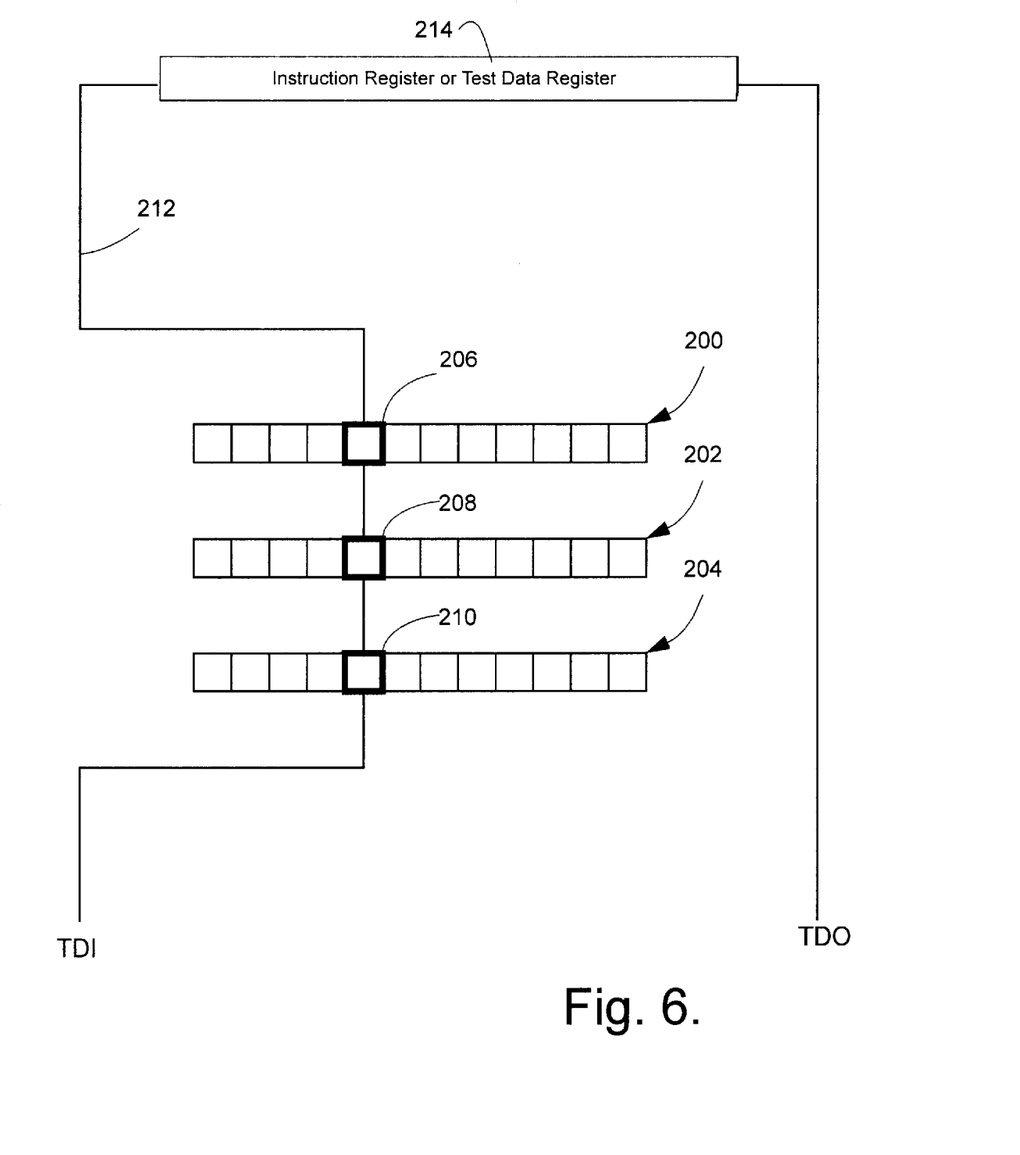
FIG. 6 illustrates an embodiment of the present invention in which an instruction register bit in each test access circuit between a test data input and a test resource are connected in series between the test data input and the input of the test resource to facilitate controlling the state of child test access ports.

In summary, it will be seen that the present invention provides an efficient and effective method of routing scan data through test access circuit hierarchy in an integrated circuit, as illustrated in FIG. 6. FIG. 6 shows three instruction registers 200, 202 and 203 corresponding to three test access circuits, which, for simplicity, have not be shown. The instruction registers have respective register bits, 206, 208 and 210 serially connected in a scan path 212 which extends from a circuit serial input, TDI, to the serial input of a target test resource 214. The serial output of the test resource is connected to the circuit serial output TDO, as previously explained. As also mentioned, the instruction register bits could alternatively be connected between the serial output of the test resource and TDO.

The method is generally comprises serially connecting the register bit of the instruction register of each test access circuit residing in or along a scan path 212 which includes a target test resource 214. The register bit controls the state of a child test access circuit in the scan path. With each access of the test resource, there is appended to scan data to be delivered to the test resource along the scan path, configuring data for each register bit for use in establishing a scan path for a following operation. Since the last test access circuit in the chain does not control a child test access circuit, the value of its register bit is not important and could be omitted from the scan path.

When the target test resource is controlled by a test resource parent test access circuit in the scan path, the configuring data includes a bit destined for the register bit of the grandparent test access circuit of the target test resource for configuring the parent test access circuit in an instruction register access mode or a data register access mode in the operation which follows the current operation The configuring data also includes a configuring bit for configuring all parent test access circuits in the scan path in the data register access mode in the following operation.

When the scan data includes an instruction for a test access circuit, the instruction includes test port select bits for selecting a child test resource of the test access circuit, and includes configuring data for the parent of the test access circuit for configuring the test access circuit in an instruction register access mode and configuring data for configuring other all parent test access circuits in data register access mode in the following operation.

Loading an instruction in a different target test access circuit higher up in the hierarchy, simply comprises inserting, in the scan data of the operation immediately preceding loading of the instruction, configuring data destined for the register bit of the parent of the target test access circuit for configuring the target test access circuit in instruction register access mode and configuring data for configuring all other parent test access circuits of the target circuit in a data register access mode. The state of all test resources (instruction registers and test controllers) lower down in the hierarchy will remain unchanged. This means that the partial scan path from the child test access circuit of a different test access circuit higher up in the hierarchy to the test resource that was last accessed is maintained and will be available when a different test access circuit higher up in the hierarchy is configured in data register access mode. This also means that test controllers previously configured to perform a test can continue to operate. The last two statements apply until any one of the parent test access circuits is reset or new instructions are loaded to change the test port select bits.

It will also be seen that the present invention overcomes the disadvantages of the aforementioned prior art. Unlike Muradali et al, the present invention provides a mechanism for individually enabling only one test access circuit and does not require loading instructions into all test access circuits every time an instruction change is needed in any one of the test access circuits. This results in much shorter times to load instructions. The present invention is also compatible with a block based design approach because it is possible to verify blocks independently of other blocks without any knowledge of the contents of other blocks which might not be defined. As previously mentioned, The logic of the child test access circuits is tested in the same manner as any other logic of the parent block using conventional scan test methods. This way, all child test access circuits can be thoroughly tested before being used to perform any operation.

Further, unlike Dervisoglu et al, in which child test access circuits are reset, as soon as they are deselected, and thus do not allow running test controllers in parallel in different test access circuits, test access circuits according to the present invention are not reset and thus allow running test controllers in different blocks at the same time using different test parameters under the control of the instruction of the selected block(s). Some blocks can even continue to operate in functional mode while others are in test mode.

Further, the architecture of the present invention does not requires concatenating test access circuits at the same level of hierarchy and, therefore, does not require long, instruction streams to groups of test access circuits at the same time. The protocol of the present invention makes it possible to navigate quickly through the test access circuit hierarchy especially when test resources, like test/BIST controllers, need to be accessed concurrently in different branches of the hierarchy.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A test access circuit (TAC) for use in controlling test resources including child test access circuits (TACs) and/or test controllers in an integrated circuit, comprising:

an enable input for enabling or disabling access to said TAC and test resources associated with said TAC;

a test port associated with each said test resources, each test port including:
   a test port enable output for connection to an enable input of an associated test resource; and
   an input for receiving a serial output of said associated test resource; and means for selecting a test resource for communication therewith.

2. A test access circuit as defined in claim 1, further including an instruction register having:
   test access circuit control bits for connection to corresponding control inputs of each child TAC associated with said circuit; and
   test controller control bits for connection to corresponding control inputs of each test controller associated with said circuit;
   said control bits including an enable bit for each associated test resource for connection to an enable input of said each associated test resource.

3. A test access circuit as defined in claim 2, said means for selecting including:
   test port select bits in said instruction register for identifying a selected test resource and for determining the state of each said enable bit; and
   a selector responsive to said test port select bits for selecting the serial output of said selected test resource for connection to a serial output of said circuit.

4. A test access circuit as defined in claim 2, said test access circuit control bits further including a child instruction register select bit for connection to an instruction register select input of each said associated child TAC for selecting between instruction register access and test data register access of said associated child TAC.

5. A test access circuit as defined in claim 4, said test access circuit control bits further including a link bit for enabling the addition of said child instruction register select bit into a register scan path of an associated child TAC.

6. A test access circuit as defined in claim 5, said child instruction register select bit being responsive to an active instruction register select input by selecting as input a serial output of an instruction register bit and by connecting its output to a serial input of an instruction register bit and being responsive to an inactive instruction register select input by selecting as input a serial input of said test access circuit and connecting its output to an internal serial output for connection to a test resource serial input.

7. A test access circuit as defined in claim 6, said child instruction register select bit further including means to enable said child instruction register select bit to perform shift, capture, and update operations when said test access circuit is configured in data register access mode.

8. A test access circuit as defined in claim 7, said scan path comprising connecting the serial input of said test access circuit to the serial input of said child instruction register select bit and connecting the serial output of the child instruction register select bit to a serial input of a test resource.

9. A test access circuit as defined in claim 1, said circuit further including a serial input connected to a serial input of said instruction register and of each of said test resources.

10. A test access circuit as defined in claim 1, further including an external test mode input for configuring a module associated with said test access circuit in an external test mode when said test mode input is set to an active value.

11. A test access circuit as defined in claim 1, said test access circuit further including gate means responsive to said enable input for gating update, capture and shift input signals applied to said circuit.

12. A test access circuit (TAC) for use in a module of an integrated circuit, comprising:
   an external interface for communicating with a TAC located one level up of TAC hierarchy, said external interface including:
      a serial input;
      a serial output;
      a clock input; and
      a number of TAC control inputs, including an instruction register select input for selecting an instruction register or a data register;
      a test access circuit enable input for enabling access to TAC test resources including test controllers and test access circuits when said enable input is set to an active value and for disabling access to said resources when set to an inactive value;
   an internal interface for communicating with test resources, including test controllers in said module and TACs one level down of TAC hierarchy;
   said internal interface including:
      a serial output for connection to a serial input of each associated test resource;
      a test port for each test resource associated with said TAC, each test port including:
         a test port enable output for connection to an enable input of an associated test resource; and
         an input for receiving a serial output of said associated test resource;
      test controller control outputs for connection to associated test controllers in said module;
      TAC control outputs for connection to associated child TACs; and
   an instruction register including:
      test port select bits for selecting a test port and for determining the state of enable outputs; and
      a child instruction register select bit for connection to the instruction register select input of each child TAC one level down in hierarchy.

13. A test access circuit as defined in claim 12, said external interface further including an external test mode input for configuring said module in an external test mode when said test mode input is set to an active value.

14. A test access circuit as defined in claim 12, said instruction register further including a link bit for enabling the addition of the child TAC instruction register select bit of said TAC to a scan path when said instruction register select input is inactive.

15. A test access circuit as defined in claim 12, said child instruction register select bit being a test data register padding circuit for appending said select bit to a test data register when said TAC instruction register select input is inactive.

16. A test access circuit as defined in claim 15, said child instruction register select bit having shift, capture, update inputs for performing shift, capture, update operations, respectively, concurrently with said test data register; and including:
   gating means for gating said update input for producing an active update signal whenever an active UpdateDR signal is applied to said test data register;
   gating means for gating said shift input for producing an active shift signal whenever an active ShiftDR signal is applied to said test data register; and gating means for gating said capture input for producing an active capture signal whenever an active CaptureDR signal is applied to said test data register;

means connecting said serial input of the said external interface to the serial input of said child instruction register select bit; and means connecting the serial output of said child instruction register select bit to said serial output of said internal interface.

17. A test access circuit as defined in claim 15, said child instruction register select bit having shift, capture, update inputs for performing shift, capture, update operations, respectively, concurrently with said test data register; and including:

gating means for gating said update input for producing an active update signal whenever an active UpdateDR signal is applied to said test data register;

gating means for gating said capture input for producing an active capture signal whenever an active CaptureDR signal is applied to said test data register; and gating means for gating said shift input for producing an active shift signal whenever an active ShiftDR signal is applied to said test data register; and means connecting the serial output of the selected test data register to the serial input of said child instruction register select bit; and means connecting the serial output of said child instruction register select bit to said serial output of said external interface.

18. A test data register padding circuit for use in an instruction register of a test access circuit, for adding the content of said padding circuit to a test data register scan path when an instruction register select input is inactive, said padding circuit including:

an output; and gate means for enabling said padding circuit to perform shift, capture, and update operations in response to an inactive instruction register select input.

19. A test data register padding circuit as defined in claim 18, further including a selector for selecting between a serial output of an instruction register shift element and a test access circuit serial input and responsive to an active instruction register select input for selecting said serial output of an instruction register shift element and otherwise selecting said test access circuit serial input.

20. A test access circuit for use in accessing test controllers in an integrated circuit having a hierarchy of test access circuits which control respective test resources in the integrated circuit, an improvement comprising:

a test access circuit instruction register having a child test access circuit configuring register which is configurable for serial interconnection with other registers of said instruction register when said test access circuit is configured in instruction register access mode and which serially connected in a scan path between a serial input and a serial output when said test access circuit is configured in a data register access mode.

21. A method of accessing a test controller in an integrated circuit having a plurality of test access circuits arranged in a plurality of levels of test access circuit (TAC) hierarchy including a top-level TAC and at least one child TAC connected to said test controller, comprising:

loading an instruction into the top-level TAC to:
select a test port corresponding to a child TAC; and
configure said child TAC to perform an instruction register access by setting a child instruction register select bit to an active value; and loading an instruction into said child TAC to:
select a test port corresponding to said test controller; and
configure said test controller to perform desired test operations by setting test controller control bits to values corresponding to said desired operations.

22. A method as defined in claim 21, said configure said test controller to perform desired test operations including configuring said test controller to perform a default test operation.

23. A method as defined in claim 22, said loading an instruction includes sampling and scanning out status input bits.

24. A method as defined in claim 21, said configure said test controller to perform desired test operations comprising:

configuring said test controller to perform test data register access; and, loading an instruction into said top-level TAC to configure said child TAC to perform test data register access; and performing a test data register access by scanning data into and out of said test data register.

25. A method as defined in claim 24, said performing a test data register access including performing said test data register access a predetermined number of times and then:

loading an instruction into said top-level TAC to configure said child TAC to perform instruction register access; and loading an instruction into said child TAC.

26. A method as defined in claim 25 said loading an instruction into said child TAC includes loading an instruction for configuring said test controller to perform test operations.

27. A method as defined in claim 25, said loading an instruction includes sampling and scanning out status input bits.

28. A method of configuring test access circuits for accessing a test controller in an integrated circuit having a hierarchy of test access circuits which control test resources in the integrated circuit, the method comprising:

for each test access circuit in a scan path between a circuit serial input and a circuit serial output and containing a serial input and serial output of a parent test access circuit of a target test resource:

loading an instruction into the test access circuit to insert the instruction register of a selected child test access circuit into said scan path; and selectively replacing the instruction register of the test access circuit in said scan path by a child test access circuit configuring register of the instruction register of the test access circuit for use in subsequent operations for configuring said child test access circuit.

29. A method as defined in claim 28, said loading an instruction including loading a bit into each configuring register existing in said scan path for maintaining a corresponding test access circuit in a data register access mode.

30. A method as defined in claim 29, said loading an instruction including loading test port select bits into the instruction register of said test access circuit for selecting said child test access circuit, and generating from said test port select bits an active enable bit for said child test access circuit and an inactive enable bit for all other test resources of said test access circuit.

31. A method as defined in claim 28, said selective replacing comprises replacing the instruction register of all parent test access circuits except for said test resource parent test access circuit.

32. A method as defined in claim 28, further including accessing said target test controller including loading an instruction containing test controller control bits into said test controller parent test access circuit for configuring said test controller to perform a desired operation, said instruction including an active bit in the child test access circuit configuring register of the grandparent test access circuit of the test controller so as to configure said test controller parent test access circuit to perform an instruction register access.

33. A method as defined in claim 28, said loading an instruction includes loading a value for a link bit into the instruction register of said test access circuit and said replacing the instruction register being enabled by an active value of said link bit of the instruction register and being disabled by an inactive value of said link bit.

34. A method as defined in claim 33, said loading a value for a link bit includes setting the link bit to an active value for each test access circuit from a top-level test access circuit to the test controller grandparent test access circuit.

35. A method as defined in claim 28, said loading an instruction includes concurrently scanning out status bits of said target instruction register.

36. A method as defined in claim 28, wherein a top-level circuit being an IEEE 1149.1 Test Access Port.

37. A method as defined in claim 28, further including configuring a test access circuit to perform a data register access comprising setting to an inactive value the child instruction register select bit of parent test access circuits included in said instruction.

38. A method as defined in claim 28, further including configuring said target test controller to perform a desired operation including configuring said test controller to perform a test data register access.

39. A method as defined in claim 28, further including configuring said test controller to perform a desired operation including configuring said test controller to perform a default test.

40. A method as defined in claim 28, further including, when said instruction is for performing a test data register access and the next operation is an instruction, said instruction including configuring said test controller parent test access circuit to perform instruction register access by setting to an active value the child instruction register configuring bit in the grandparent test access circuit of said test controller; and, when the next operation is another test data register access, said instruction including configuring said test controller parent test access circuit to perform a data register access by setting to an inactive value the child instruction register select bit of said test controller grandparent test access circuit.

41. A method as defined in claim 40, further including, after performing a final data register access, loading an instruction into said test controller parent test access circuit, said instruction containing test controller control data to configure said test controller to perform a test and configuring said test controller parent test access circuit to perform test data register access by setting to an inactive value the child instruction register configuring bit of the test controller grandparent test access circuit.

42. A method of accessing a test controller embedded at a level N in an integrated circuit test access circuit hierarchy, the method comprising:
for each test access circuit at levels 1 to N−1 of test access circuit hierarchy:
loading an instruction into the test access circuit to select a test port, and,
if said test port is associated with a child test access circuit, said
instruction further including:
data for configuring said child test access circuit to perform an instruction register access; and
data for configuring said test access circuit to perform a data register access; or
if said test port is associated with a test controller, said instruction
further including:
data for configuring said test controller to perform a desired operation; and
except for said test access circuit at level N−1, adding to a test data register padding circuit, a bit corresponding to said child test access circuit for configuring said child test access circuit to perform an instruction register access or a data register access mode in a subsequent instruction or data register access.

43. A method as defined in claim 42, after performing a test data register access and, further including:
if a following operation is an instruction, configuring the test access circuit at level N−1 to perform an instruction register access by setting to an active value the corresponding bit of the padding circuit in the test access circuit at level N−2; and,
if said following operation is test data register access, configuring the test access circuit at level N−1 to perform a data register access by setting to an inactive value the corresponding bit of the padding circuit in the test access circuit at level N−2.

44. A method as defined in claim 43, further including, when performing a final data register access prior to loading an instruction into the test controller parent test access circuit, setting to an active value the corresponding bit of the padding circuit in the test access circuit at level N−2, loading an instruction containing test controller control data into the test access circuit at level N−1 to configure said test controller to perform a test and configuring said test access circuit at level N−1 to perform test data register access by setting to an inactive value the corresponding bit of the padding circuit in the test access circuit at level N−2.

45. A method as defined in claim 42, said instruction further including link data associated said test access circuit for selectively enabling or disabling adding said bit to said padding circuit, said link data having a first value to enable the addition of said bit to said padding circuit and a second value to disable addition of said bit to said padding circuit.

46. A method as defined in claim 45, said link data having said first value for each test access circuits at levels 1 to N−2.

47. A method as defined in claim 42, said loading an instruction including concurrently unloading test controller status bits.

48. A method of routing scan data through test access circuit hierarchy in an integrated circuit, said method comprising:
serially connecting a register bit of an instruction register of each test access circuit residing along a scan path which includes a target test resource, said register bit controlling the state of a child test access circuit in said path; and
with each access of said test resource, appending to said scan data, configuring data for each said register bit for use in establishing a scan path for a following operation.

49. A method as defined in claim 48, said scan path being connected between a circuit serial input and a circuit serial output.

50. A method as defined in claim 48, when said target test resource is controlled by a test resource parent test access circuit in said scan path, said configuring data including a bit destined for the register bit of the grandparent test access circuit of said target test resource for configuring said parent test access circuit in an instruction register access mode or a data register access mode.

51. A method as defined in claim 50, said configuring data including a configuring bit for configuring all parent test access circuits in said scan path in said data register access mode in a following operation.

52. A method as defined in claim 48, when said scan data includes an instruction for a test access circuit, said instruction including test port select bits for selecting a child test resource of said test access circuit, and including configuring data for the parent of said test access circuit for configuring said test access circuit in an instruction register access mode and configuring data for configuring other all parent test access circuits in data register access mode.

53. A method as defined in claim 48, further including, loading an instruction in a target test access circuit higher up in said hierarchy, comprising:

inserting, in the scan data of the operation immediately preceding loading of said instruction, configuring data destined for the register bit of the parent of said target test access circuit for configuring said target test access circuit in instruction register access mode and configuring data for configuring all other parent test access circuits in a data register access mode.

* * * * *